United States Patent [19]

Fischer et al.

[11] Patent Number: 5,185,291
[45] Date of Patent: Feb. 9, 1993

[54] METHOD OF MAKING SEVERABLE CONDUCTIVE PATH IN AN INTEGRATED-CIRCUIT DEVICE

[75] Inventors: Frederick H. Fischer; Kuo-hua Lee, both of Lower Macungie Township, Lehigh County; William J. Nagy, Bethlehem; Nur Selamoglu, Philadelphia, all of Pa.

[73] Assignee: AT&T Bell Laboratories, Murray Hill, N.J.

[21] Appl. No.: 755,702

[22] Filed: Sep. 6, 1991

Related U.S. Application Data

[60] Division of Ser. No. 569,755, Aug. 20, 1990, Pat. No. 5,066,998, which is a continuation of Ser. No. 374,423, Jun. 30, 1989, abandoned.

[51] Int. Cl.$^5$ ............................................ H01L 21/26
[52] U.S. Cl. .................... 437/173; 437/170; 437/189; 437/203; 437/922; 148/DIG. 55
[58] Field of Search ............... 437/170, 173, 189, 203, 437/922; 148/DIG. 55

[56] References Cited

U.S. PATENT DOCUMENTS

| | | | |
|---|---|---|---|
| 3,619,725 | 11/1971 | Soden et al. | 148/DIG. 55 |
| 3,740,523 | 6/1973 | Cohen et al. | 437/173 |
| 4,124,899 | 11/1978 | Birkner et al. | 364/716 |
| 4,875,971 | 10/1989 | Orbach et al. | 437/195 |
| 4,900,695 | 2/1990 | Takahashi et al. | 437/189 |
| 5,026,664 | 6/1991 | Hongo et al. | 437/173 |

*Primary Examiner*—Brian E. Hearn
*Assistant Examiner*—Linda J. Fleck
*Attorney, Agent, or Firm*—John T. Rehberg

[57] ABSTRACT

Integrated-circuit devices are provided with conductive paths or links which, by laser irradiation or electric current pulsing, can be severed or fused. In the interest of ease of fusing, preferred links have locally reduced thickness as achieved, e.g., by employing two steps of layer deposition and etching as follows: first, a layer of conductor material is deposited on a dielectric surface, and locally reduced in thickness by etching at one or several points selected for fusing, and, second, a further layer of conductor material is deposited, and then etched to produce a desired conductive path passing through such points.

5 Claims, 2 Drawing Sheets

METHOD OF MAKING SEVERABLE CONDUCTIVE PATH IN AN INTEGRATED-CIRCUIT DEVICE

This is a division of application Ser. No. 569,755 filed Aug. 20, 1990, now U.S. Pat. No. 5,066,998, which is a continuation of application Ser. No. 374,423 filed Jun. 30, 1989, abandoned.

CROSS-REFERENCE TO RELATED APPLICATIONS

Filed of even date are U.S. Pat. No. 5,025,300 issued Jun. 18, 1991 to J. N. Billig et al. and U.S. Pat. No. 4,919,748 issued Apr. 24, 1990, both assigned to the assignee of the present application.

TECHNICAL FIELD

The invention is concerned with integrated-circuit devices including conductive paths which are adapted for severing, e.g., by laser irradiation.

BACKGROUND OF THE INVENTION

In the manufacture of integrated-circuit devices, conductive paths or links are typically provided in the form of one or several conductive layers which are patterned by etching in the presence of a mask. In many instances, in the interest of providing for redundancy with respect to device functions for example, it is desirable to include links which can be severed or fused, e.g., depending on the outcome of tests carried out on a device structure. In this respect, and more specifically with respect to complementary metal-oxide-semiconductor (CMOS) devices (see, e.g., U.S. Pat. No. 4,589,388, issued May 20, 1986 to D. G. Clemons et al., entitled "CMOS Spare Decoder Circuit"), conductive paths may be severed by laser irradiation ("laser programming") or else by a suitable electric current pulse through the path. And since, typically, conductive paths have significant cross-sectional area, considerable energy may be required for severing. Even more energy may be required when paths are covered by a dielectric layer; on the other hand, in the absence of such a layer, there is a danger of device impairment due to "splash", as link material removed may be redeposited on a device surface. Moreover, and especially when a dielectric has undergone planarization etching, dielectric thickness may vary across an integrated-circuit device chip, so that the amount of energy needed to sever a link may be ill-determined. As a consequence either too much or too little laser energy may be supplied in an attempt at laser programming—leading to device damage or to incomplete severing of a conductive path.

In view of such and similar considerations it is desirable to provide for specifically selected portions of conductive paths to be more readily severed by laser irradiation or by an electric current pulse.

SUMMARY OF THE INVENTION

Preferred integrated-circuit device manufacture provides for laser-programmable or electric-current-programmable link features having locally reduced cross-sectional area resulting from locally reduced thickness of a conductive path, while width remains essentially constant.

Preferred processing in the manufacture of a device includes deposition of a layer of conductive material on a dielectric, localized etching to form one or several areas of reduced thickness, and conductive-path pattern etching. Localized etching may be timed to ensure adequate residual layer thickness; alternatively and preferably, a two-step process is used for deposition and patterning as follows: A first layer of conductor material is deposited on a dielectric surface, the thickness of such layer being less than the thickness of the intended conductive path. This deposited layer is etched locally to form depressions, preferably in the form of holes or "windows" exposing the underlying dielectric, the dielectric thus serving as an etch stop. Then, a second layer of conductor material is deposited, and etched to produce a desired conductive path. In this preferred case, at points where the first layer was etched, path thickness is determined by second-layer thickness; elsewhere, the thickness is determined by the sum of first- and second-layer thickness.

DETAILED DESCRIPTION

Figure 1:
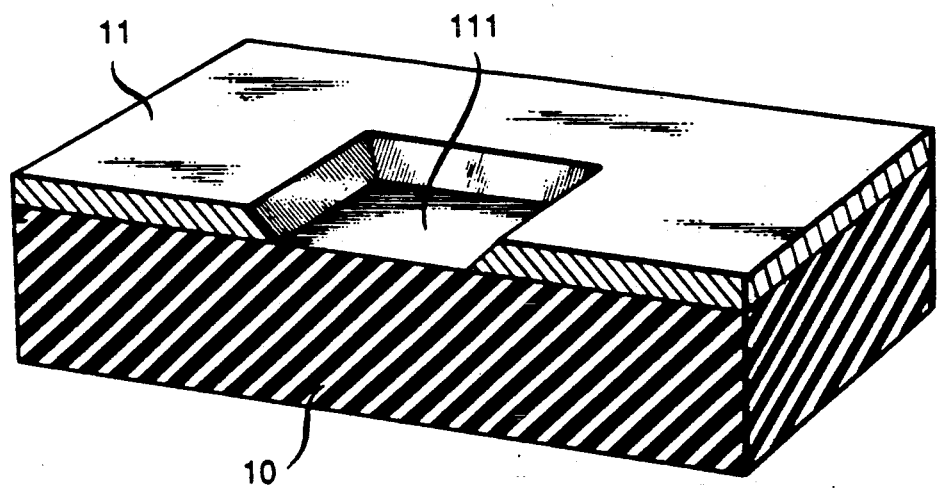
FIG. 1–3 are schematic perspective views of a portion of an integrated-circuit device chip at different stages of processing in accordance with a preferred embodiment of the invention.

FIG. 1 shows dielectric 10 on an integrated-circuit device chip. Typically, dielectric 10 comprises a plurality of separately deposited layers as included to isolate a semiconductor substrate from conductor layers, as well as conductor layers from each other. Dielectric layers may be deposited by chemical vapor deposition and may consist of silica-based glass such as e.g., a borosilicate or borophosphosilicate glass. FIG. 1 further shows conductor layer 11 which has been etched for programming at location 111. (Standard, positive-acting photolithographic processing can be used for this purpose.) Preferably, as shown, etching is across the entire thickness of layer 11, dielectric material 10 serving as an etch stop in this respect, thereby obviating the need for timing of the duration of etching. Typically, layer 11 consists of a metal such as, e.g., aluminum, tungsten being considered a promising alternative. Advantageously, in the case of aluminum, low-pressure chemical vapor deposition may be used for deposition; in the case of tungsten, sputtering is commonly employed.

Figure 2:
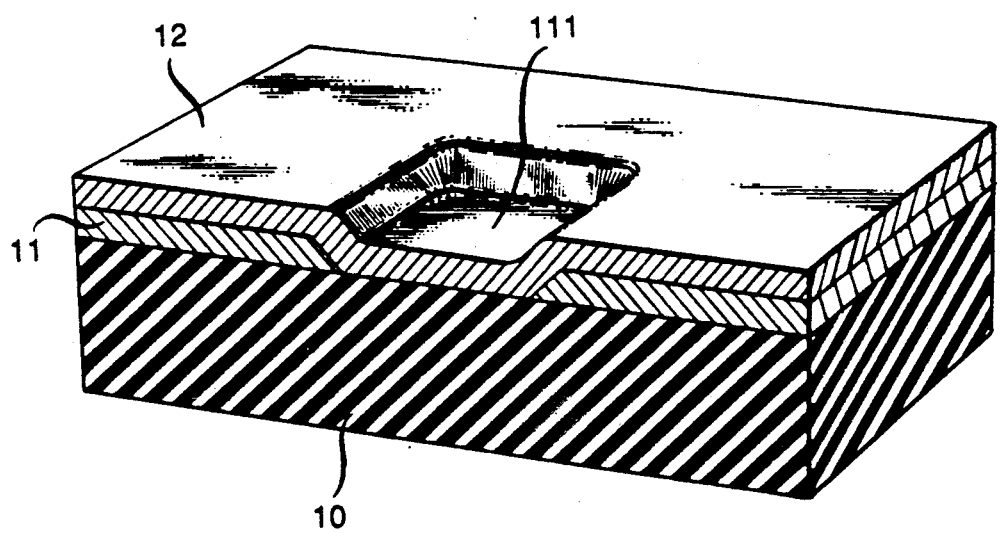

Further to features of FIG. 1, FIG. 2 shows additionally deposited conductor layer 12, typically consisting of the same material as layer 11. Preferably, in the case of aluminum as a conductor material for example, a step of back-sputtering may precede layer-12 deposition. Such step may serve, e.g., to remove a surface-oxide layer, thereby enhancing adhesion of layer-12 material.

Figure 3:
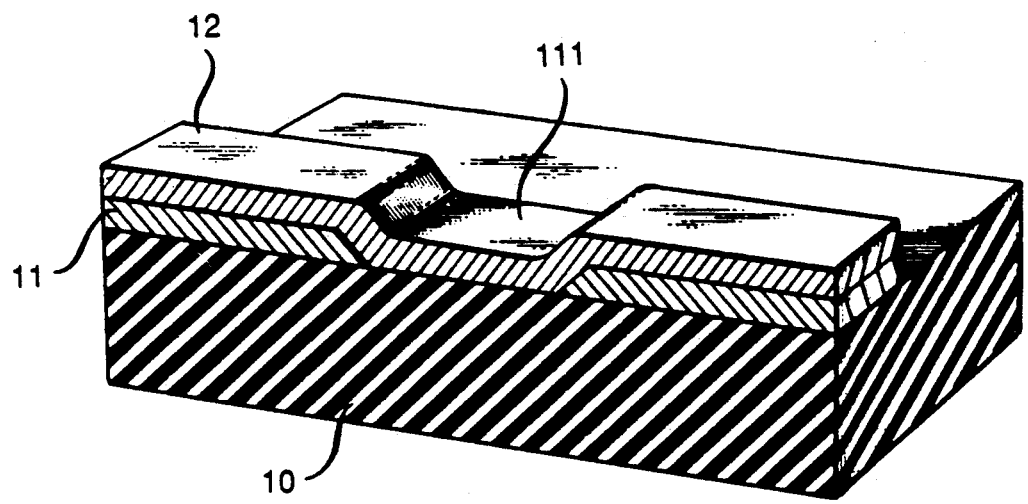

As illustrated by FIG. 3, combined layers 11 and 12 are patterned to produce a conductive path or link structure having reduced thickness at location 111.

While, typically, the same conductor material may be used for layers 11 and 12 shown in FIG. 2 and 3, the use of different materials is not precluded. For example, the material of layer 11 may be aluminum, with overlying polysilicon as layer-12 material.

In an exemplary device such as, e.g., a CMOS device, conductive paths may take the form of aluminum "runners". In such exemplary device, if runners have a specified width of 1.25 micrometer, typically specified runner thickness may be 1.0 micrometer, with reduced thickness of 0.35 micrometer at a programmable location. In this case, preferred processing of the invention involves, first, depositing a 0.65- micrometer layer of aluminum, and then, after etching at location 111, depositing an additional 0.35-micrometer layer of aluminum.

More generally, programmable-link thickness is chosen with ease of programming, current density in device operation, and electromigration considerations in mind. As a practical matter, in the interest of realizing a significant benefit from reduced programmable-link thickness, such thickness (at location 111) does not exceed two thirds of the thickness of the conductive path elsewhere.

The following features may be incorporated to advantage in preferred structures and processing sequences of the invention:

Optionally after conductive-path patterning, a protective layer may be deposited across a structure, e.g., in the form of a dielectric such as silicon dioxide or silicon nitride; when sufficiently thin, such protective layer will not interfere with laser programming, but will provide device surface protection against detrimental effects due to unintentional redeposition of conductor material residue or debris. during programming. For further details in this respect see the above-identified patent application by J. N. Billig et al., incorporated by herein reference. In this case, prior to programming, a further step of photolithography and etching may be included to uncover device bond pads. Then, after programming, a "cap" protective layer may be deposited, again followed by freeing of bond pads—as facilitated by reuse of the same photolitographic mask.

Etched windows preferably have tapered edges as shown in FIG. 1, thereby contributing to continuity ("step coverage") of the second conductor layer deposited after window etching. Preferred in this respect is dry etching in a plasma of $Cl_2$ and $CHF_3$ as described in further detail in the above-identified patent application by C. N. Bredbenner et al., incorporated herein by reference.

Windows etched into layer 11 may be wider than the width of a final runner, thereby providing for a margin of misalignment of the mask pattern used for runner etching relative to the window-etch patter: runner width will be as produced in the second etching step, and the reduced-thickness area will be self-aligned with the runner. Wider and larger windows are preferable also with respect to ease and uniformity of window etching.

As window etching may result in the deposition of residual etch products on etched surfaces ("side-wall build-up"), a cleaning step may be included optionally prior to further metal deposition. A commercially available sidewall etchant may be used for this purpose.

Figure 4:
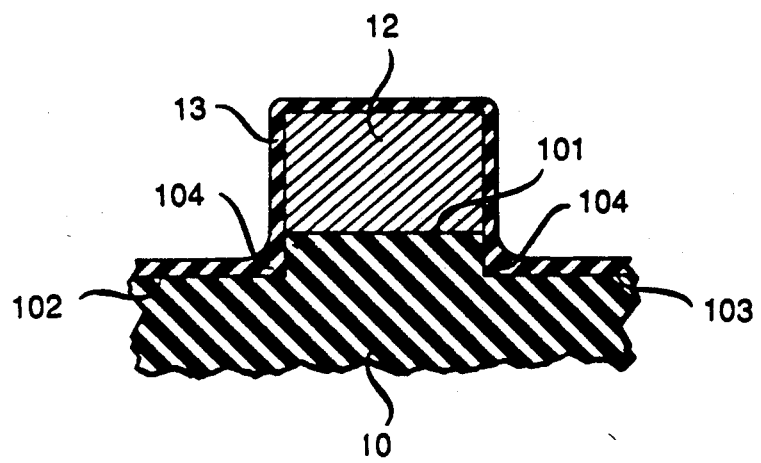
FIG. 4 is a schematic cross-sectional view at a point where a conductive path has reduced thickness in accordance with a preferred embodiment of the invention.

Among advantages of preferred processing and device structures of the invention the following are considered as particularly significant:

Since, in the course of the second etching operation (e.g., going from FIG. 2 to FIG. 3), material thickness being removed is less at location 111 as compared with the remainder of a runner being etched, some underlying dielectric material will be etched away at location 111 while the thickness of layer 11 is being etched elsewhere. As a result, a "pedestal structure" is produced as shown in FIG. 4, with the conductor 12 on dielectric portion 101 raised above the dielectric surfaces 102 and 103 on both sides of portion 101. Such structure is advantageous in that it may facilitate pull-back of conductor material away from the reduced-thickness area during programming. As a further benefit of such structure, in the case of inclusion of a protective cover layer 13, a more uniformly thin cover layer is realized on a conductive path. This benefit is due to the fact that the conductor-dielectric interface is spaced away from corner 104 where protective-cover material tends to have increased thickness. Uniformly thin coverage in turn contributes to ease and uniformity of fusing during laser programming. These benefits are realized also when severing or fusing of a preferred link of the invention is by means of a suitable electric current pulse through the link, possibly in combination with laser irradiation.

On account of merely locally reduced thickness of conductive paths of the invention, and full thickness to both sides of a fusible link, thermal and mechanical buffering is realized during fusing, preventing local overheating, and enhancing pull-back or roll-back of molten conductor material during the fusing process. Also, on account of reduced link thickness relative to exposed link surface, heating by surface irradiation is more uniform throughout the thickness of the link. As a result, link material is more completely ejected during fusing, and debris formation is minimized. Reduced link cross section is advantageous further in that fusing may be effected at lower energy levels, and over a broader energy range—thereby extending the utility of laser-fusing equipment as currently employed.

Preferably, fusible links of the invention are included in the topmost metallization, thereby further contributing to thermal buffering as semiconductor active areas are separated from fusible links by a considerably thickness of dielectric material. Inclusion of fusible links at the topmost level is advantageous also in the interest of freedom of placement of such links, with fewer restrictions on the placement of lower-level interconnect layers. Moreover, upper-level dielectric materials typically include constituents such as boron and/or phosphorus whose presence beneath a fusible link is advantageous in that such constituents can serve as gettering agents for ionic contaminants as may be introduced unintentionally after laser programming and before final passivation.

EXAMPLE

In a CMOS device a programmable link was included in an aluminum runner approximately 1.25 micrometer wide, approximately 1.0 micrometer thick, and with a programmable-link reduced thickness of approximately 0.35 micrometer. Such reduced thickness was produced by the two-step process described above, involving first and second steps of layer deposition and etching. The window produced in the first etching step had approximate dimensions of 10 micrometers in the direction of the intended runner, and 8 micrometers across.

A neodymium-YAG laser having a beam diameter of approximately 5 micrometers was used to sever the runner at the site of the programmable link, as well as, for the sake of comparison, at a point away from the link. In the latter case, an energy of approximately 1.2 microjoule was required for severing; in the former case, at the link site, an energy of approximately 0.9 microjoule was sufficient.

We claim:

1. In the manufacture of integrated circuit devices, a method for making a dielectric-supported conductive path comprising a programmable link, said method comprising the steps of blanket depositing a first conductor layer on said dielectric, etching to locally reduce the thickness of said first conductor layer, depositing a second conductor layer on said first conductor layer, and then etching to define said conductive path, whereby said conductive path has locally reduced thickness as adapted for programming.

2. The method of claim 1 in which etching of said first conductor layer results in local exposure of said dielectric.

3. The method of claim 1 in which etching of said first conductor layer produces sloping walls.

4. The method of claim 1 in which the material of said second conductor layer is essentially the same as the material of said first conductor layer.

5. The method of claim 1 in which at least one of said first and second conductor layers comprises aluminum.

* * * * *